United States Patent [19]
Ogden et al.

[11] Patent Number: 5,313,151
[45] Date of Patent: May 17, 1994

[54] INDUCTION TYPE ELECTRIC MOTOR DRIVE ACTUATOR SYSTEM

[75] Inventors: Graham M. Ogden, Bath; Robert Pearce, Bristol, both of United Kingdom

[73] Assignee: Rotork Controls Limited, United Kingdom

[21] Appl. No.: 875,699

[22] Filed: Apr. 29, 1992

[30] Foreign Application Priority Data

May 14, 1991 [GB] United Kingdom ............... 9110389

[51] Int. Cl.$^5$ .............................................. H02P 7/00
[52] U.S. Cl. ................................... 318/805; 318/432
[58] Field of Search .............................. 318/280-286, 318/434, 432, 254, 138, 439, 739, 782, 799, 806, 466-469, 796, 798, 800, 801, 803, 806, 807-812; 388/903, 907.5, 909, 930

[56] References Cited

U.S. PATENT DOCUMENTS

| | | | |
|---|---|---|---|
| 3,882,634 | 5/1975 | Wright et al. ........................ | 318/786 |
| 4,023,083 | 5/1977 | Plunkett ............................... | 318/432 |
| 4,245,181 | 1/1981 | Plunkett ............................... | 318/805 |
| 4,400,655 | 8/1983 | Curtiss et al. . | |
| 4,445,075 | 4/1984 | Fry ...................................... | 318/434 |
| 4,445,080 | 4/1984 | Curtiss ................................. | 318/798 |
| 4,450,398 | 5/1987 | Bose .................................... | 318/803 |
| 4,473,782 | 9/1984 | Reinhardt et al. ................... | 318/254 |
| 4,494,051 | 1/1985 | Bailey ................................... | 318/254 |
| 4,520,300 | 5/1985 | Fradella ............................... | 318/138 X |
| 4,673,858 | 6/1987 | Saito .................................... | 318/805 |
| 4,686,437 | 8/1987 | Langley et al. ...................... | 318/254 |
| 4,723,100 | 2/1988 | Horikawa et al. ................... | 318/254 |
| 4,761,703 | 8/1988 | Kliman et al. . | |
| 4,794,309 | 12/1988 | Saito et al. .......................... | 318/286 X |
| 4,947,091 | 8/1990 | Fukuoka ............................... | 318/434 |
| 4,958,118 | 9/1990 | Pottebaum ........................... | 318/799 |
| 4,987,358 | 1/1991 | Branam ................................ | 318/434 X |
| 5,010,287 | 4/1991 | Mukai et al. ......................... | 318/801 |
| 5,239,874 | 8/1993 | Hale ..................................... | 73/168 X |

FOREIGN PATENT DOCUMENTS

| | | |
|---|---|---|
| 1382670 | 2/1975 | United Kingdom . |
| 1550147 | 8/1979 | United Kingdom . |
| 2049321 | 12/1980 | United Kingdom . |
| 2098369 | 11/1982 | United Kingdom . |
| 2204160 | 3/1988 | United Kingdom . |
| 2196494 | 4/1988 | United Kingdom . |

Primary Examiner—Jonathan Wysocki
Attorney, Agent, or Firm—Davis, Bujold & Streck

[57] ABSTRACT

An actuator driven by an electric motor of the polyphase or single phase induction type has a stator with power windings as well as a rotor. At least one fixed fluxed sensor independent of the power windings is provided. The at least one sensor is arranged in an air gap between the stator and the rotor of the induction type motor such that the voltages induced in the at least one sensor represent a measure of the magnetic flux existing in the air gap. The flux sensor which is a preferably sensing winding provides a flux signal. An output signal representing the instantaneous output torque of the motor is generated by multiplying the flux signal by the electric current flowing through one or more of the stator power windings.

21 Claims, 3 Drawing Sheets

INDUCTION TYPE ELECTRIC MOTOR DRIVE ACTUATOR SYSTEM

BACKGROUND OF THE INVENTION

This invention relates to an actuator comprising an electric induction motor, and also to an electric motor drive system comprising an electric motor and a transmission. The invention is particularly useful in electrically driven actuators used to operate valves or penstocks in, typically, fluid transfer systems, the actuators being of the type and range as described in British Patent No. 2196494B and is concerned, primarily, with actuators in which the drive motor is of the polyphase or single phase induction type.

The aforementioned British Patent No. 2196494B describes a method of measuring the torque in the worm gear drive to the output column by giving a limited degree of axial freedom of movement to the wormshaft, which is also integral with the motor shaft, and displacing this shaft from a neutral position will compress one or other sets of springs. The springs, having a relationship between compression and spring force, will therefore cause the shaft displacement to be a function, for example a linear function, of the output torque. This movement can then be converted into an analogue electrical signal by means of a potentiometer or "Hall Effect" device or other proximity sensor.

This present mechanical method of measuring the torque produced at the column suffers from a number of limitations which have become more apparent as the various other monitoring and control functions of the actuator have been developed using direct electronic analogue and digital signal techniques. Firstly, the spring packs require to be set to a pre-load and calibrated—a task which can only be performed satisfactorily at the time of initial manufacture.

Secondly, the motor has to be constructed using a special frame to accommodate the axial movement of the shaft and cannot be removed from the actuator without disturbing the initial spring settings.

Thirdly, it is found, in practice, that the available operating torque range of any particular frame size of actuator is larger than the range achievable by a single design of spring pack—resulting in the need to provide two or more sets of spring packs to cover the whole range of output torques from a single design of actuator.

It has been proposed that the aforementioned limitations could be overcome by replacing the existing mechanically derived torque signal, in an actuator driven by a polyphase or single phase induction motor, by an accurate torque signal derived by electronic means.

SUMMARY OF THE INVENTION

Accordingly, the invention firstly provides an actuator comprising an electric motor of the polyphase or single phase induction type in which at least one fixed flux sensor independent of the power windings is provided, the at least one sensor being so arranged that voltages induced represent a measure of the magnetic flux existing in the air gap between the stator and rotor of the motor.

In preferred forms of this invention, it is possible to obtain the motor torque signal in a digital form suitable for use with micro-processor based circuitry, in place of the analogue type signals obtained by the use of a mechanically-produced signal, e.g. lever arm and spring driving a potentiometer.

The invention further provides an electric motor drive system having a final drive section, comprising an actuator as defined above, electronic means for measuring the torque generated by the electric motor of the actuator, a transmission between the electric motor output drive and the final drive section of the system, means for measuring the torque developed at a given stage of the transmission, and monitoring means responsive to both of the torque measurements to provide a signal representing the ratio of the torques.

This provides a facility for the continuous measurement, for example, of valve actuator gear box efficiency by taking a torque measurement from a point where this inefficiency has taken effect; dividing this torque by the ratio of the gear box to that point, and comparing the value, so obtained, with the motor torque. By such means the efficiency of the gear box can be sampled, or measured continuously, and any reduction in the efficiency value can be arranged to trigger warning or other devices so that corrective action can be taken before complete gear box failure occurs.

The acquisition of a torque measurement in a digitised form provides a practical means of adding a feature to valve actuator operation known as "Torque Profiling". In this feature the maximum permitted torque applied to the valve stem can be programmed and related, for example to the valve position. Typically, a high starting torque can be permitted when the valve is being moved off its seat-the maximum permitted torque then being reduced on a controlled curve as the valve opens. Similarly, the maximum permitted torque profile on a closing operation can be so arranged to give increased permitted torque as the valve closing member is forced against the valve seat. In this way it is possible to protect the valve from excessive torque levels during mid-stroke.

The traditional method of predicting the torque output of an induction motor is by using an equation of the general form:

$$\text{torque} = \frac{V^2 \cdot R_2}{(w_s \cdot s) \cdot [(R_1 + c \cdot R_2/s)^2 + (x_1 + c \cdot x_2)^2]}$$

where
$c = 1 + z_l/z_m$
$V$ = applied phase voltage
$z_l$ = stator leakage impedance
$z_m$ = magnetising branch impedance
$R_1$ = stator resistance
$R_2$ = referred rotor resistance
$x_1$ = stator leakage reactance
$x_2$ = referred rotor leakage reactance
$s$ = fractional slip
$w_s$ = frequency of stator voltage A major practical difficulty in using this equation to determine motor torque is the variation of the rotor resistance $R_2$ with rotor temperature. The rotor operates over a wide temperature range in valve actuators and, furthermore, it is necessary to obtain accurate torque readings whilst the motor has not yet reached steady state temperature conditions. Since the rotor circuits are contained wholly within the rotor, there is no simple way of obtaining an instantaneous and direct value of the rotor resistance $R_2$.

A further difficulty concerns the fractional slip term "s" used in the traditional formula. The actual "slip" in an induction motor is a small value number—typically a few tens of revolutions per minute compared with the rotating field and rotor speeds of up to three thousand revolutions per minute. Thus, the numerator in the fractional slip term is made up by the subtraction of two relatively large numbers (field rotational speed minus the actual rotor speed). A small error in measuring these two speed values will, therefore cause a relatively large error in the numerator of the fractional slip term "s".

It is also noted that the traditional torque equation is based on steady state operating conditions. It will give inaccurate answers during electrical transients and, although these transients are fairly short-lived (e.g. 10 milliseconds to 300 milliseconds) they may be long enough for an actuator to over-tighten a valve resulting in damage to the valve seating.

In the method of determining the motor torque, the subject of this invention, it can be shown that the instantaneous value of the torque produced in the rotor of a three phase machine can be expressed as:

$$torque = (1/\sqrt{3}).(i_{sv} - i_{sw}).\phi_{md} - i_{su}.\phi_{mq}$$

where:

$i_{sv}, i_{sw}, i_{su}$ = currents flowing into the stator phases—denoting the three phases by the usual suffix U,V,W.

$\phi_{md}, \phi_{mq}$ are measurements of the air gap flux taken at points 90° electrical degrees apart. $\phi_{md}$ is centred on the U phase.

The two product terms $[(1/\sqrt{3}).(i_{sv} - i_{sw}).\phi_{md}]$ and $[i_{su}.\phi_{mq}]$ will each comprise a sine wave at twice the mains frequency (the "ripple component") plus an offset term (the "steady component"). If the torque information is required at a rate not exceeding twice the mains frequency, then only one of these terms, for instance $[i_{su}.\phi_{mq}]$, need be computed.

It is only the steady component of $[i_{su}.\phi_{mq}]$ which is of interest as the ripple component sums to zero over a mains half cycle. The ripple component needs to be suppressed in order to obtain a signal which is suitable for control purposes. One practical method of obtaining the steady component of torque is to sample the current and flux at every 360°/2n (n being an integer greater than 1) of the mains cycle, which interval corresponds to 360°/n of the ripple period. If n such terms are averaged, then the ripple component will sum to zero. This is because of the identity:

$$\sum_{i=1}^{n} \sin(2\pi/i + \theta) = 0,$$

where $\theta$ is an arbitrary phase displacement

This sampling method is particularly appropriate to micro-processor based circuitry; it is fairly easy to sample at the right points using on-chip timing circuitry and the computation, being relatively infrequent (a few times per mains half cycle) is not onerous—it frees the processor for other tasks. Other tasks could, for example, include computation of the expected motor temperature as a predetermined function of time, given that a program has as an input a motor's power winding current. An analogue implementation based on a phase-locked-loop (to multiply the mains frequency by 2n) is also possible.

It will be appreciated that the equation:

$$torque = (1/\sqrt{3}).(i_{sv} - i_{sw}).\phi_{md} - i_{su}.\phi_{mq}$$

may be adapted to cover single-phase motors or polyphase motors with any number of phases. It is perfectly valid to compute this equation (or an equivalent one) in its entirety but more than one flux and more than one current must be measured. Where just one of the product terms is computed, it can also be appreciated that other methods of ripple suppression may be used without departing from the essential features of the invention.

Not only the various torque profiles but also many other operating parameters may be set in the actuator's control circuitry. This may be carried out directly by obtaining access to the actuator, but it is clearly advantageous not to have to open the body of the actuator to the exterior environment. Accordingly, the present invention also provides a valve actuator system comprising: an actuator according to the invention as defined above; a control system for the actuator responsive at least to operating parameters of the actuator, comprising a receiver for input data relating to the actuator operating parameters; and further comprising a remote programming device, exterior to the actuator, programmable with the input data and adapted selectively to transmit the recorded input data to the receiver.

The programming device preferably comprises a bar code reader, for the most convenient means of selecting and entering input data from pre-printed "menus", corresponding to desired operational features.

A preferred embodiment of the invention will now be described, by way of example only, with reference to the accompanying drawings, in which:

DETAILED DESCRIPTION OF THE INVENTION

Figure 1:
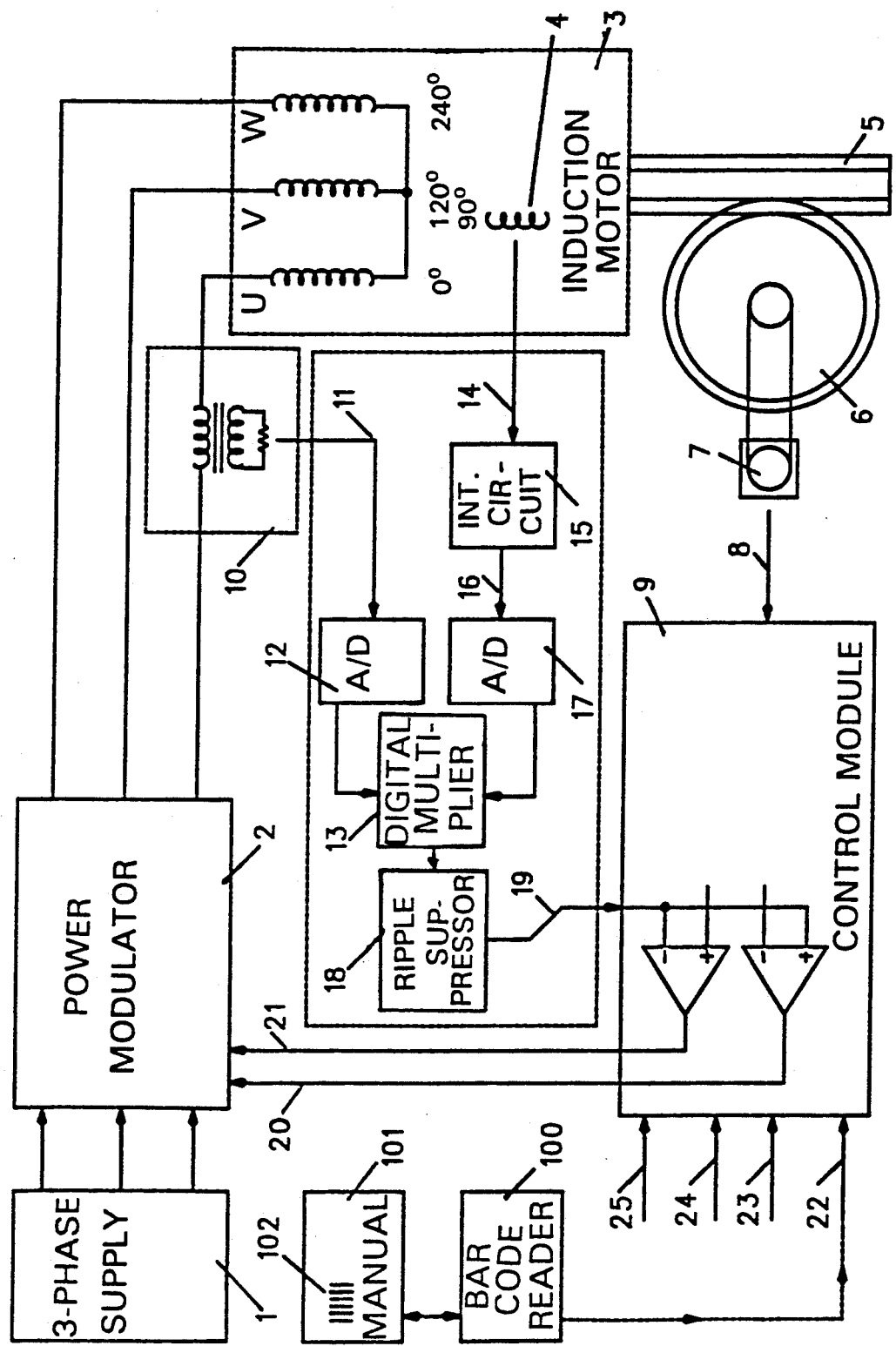
FIG. 1 is a measurement and control circuit diagram of an actuator using the method of torque determination described above.

With reference first to FIG. 1 the three phase mains supply 1 is connected to the reversing contactor 2 or other power modulator (soft-starter, inverter, cycloconverter) the outputs from the reversing contactor passing to the induction motor 3.

The induction motor 3 is provided with a sensing coil winding 4 in the stator slots which is in addition to the three phase power windings. A voltage is induced in the sense winding 4 which is proportional to the magnetic flux in the air gap. The flux sensing coil winding 4 has a high output impedance (substantially greater than that of the power windings of the motor). Accordingly, the current drawn from this is negligible and the sensed voltage is therefore substantially independent of temperature-dependent changes in winding resistance.

The motor 3 output shaft 5 drives the column of the valve actuator 6 via a reduction gear box which is shown as a single worm and worm-wheel drive. The column is provided with a position feed back device 7 (potentiometer, counter or Hall Effect device etc.)

which provides a signal 8 of valve position to the actuator control module 9.

In order to compute the motor output torque it is necessary to obtain a current signal proportional to the mains phase current. This is achieved by fitting a current transformer or other form of current sensor 10 to one of the mains conductors running from the reversing contactor 2 to the motor 3. It would be possible alternatively to sense the current into the contactor. The current signal 11 passes to an analogue to digital converter 12 and thence to the digital multiplier 13.

A measure of the airgap flux could be obtained by one or more sense winding or windings performing the function of the sense coil 4. These may take several forms: they may be concentrated or distributed, full or short-pitched, the choice being largely a matter of manufacturing convenience. The windings will typically be located in the stator slots. The sense windings are connected to high impedance circuitry and may be of thinner gauge wire than the main windings. It is also possible to use a Hall-Effect sensor or sensors to measure the flux directly, and in this case no integration of the signal is needed.

The voltage 14 generated by the sense coil is processed by an integration circuit 15. The resulting flux signal 16 passes to a second analogue to digital converter 17 and thence to the digital multiplier 13. The output from the digital multiplier 13 passes to a ripple suppressor unit 18—the steady torque signal output 19 passing to the actuator control module 9. From the actuator control module 9, output signals 20 and 21 pass to the reversing contactor or equivalent power modulator 2 to cancel the command to the motor to rotate in the "valve-to-open" or "valve-to-close" directions respectively.

The actuator control module is also provided with various input command and setting signals. In a typical case these will consist of two command signals 22,23 to instruct the valve to go in the "open" or "close" direction and two setting signals 24,25 to determine the limits of travel of the actuator column (and hence valve position) and the limiting torques at which it is required that the motor cuts out. The latter setting signals may be by means of an electro-magnetic radiation nature as described in the aforementioned GB-2196494B, e.g. optical or other electromagnetic radiation, or it may be of a mechanical setting form. In either case, the input position signal 8 and the input torque signal 19 are compared with the respective values as pre-set by the position setting signal 24 and the torque setting signal 25, and the motor is caused to stop when one or other coincidence is achieved.

Figure 2:
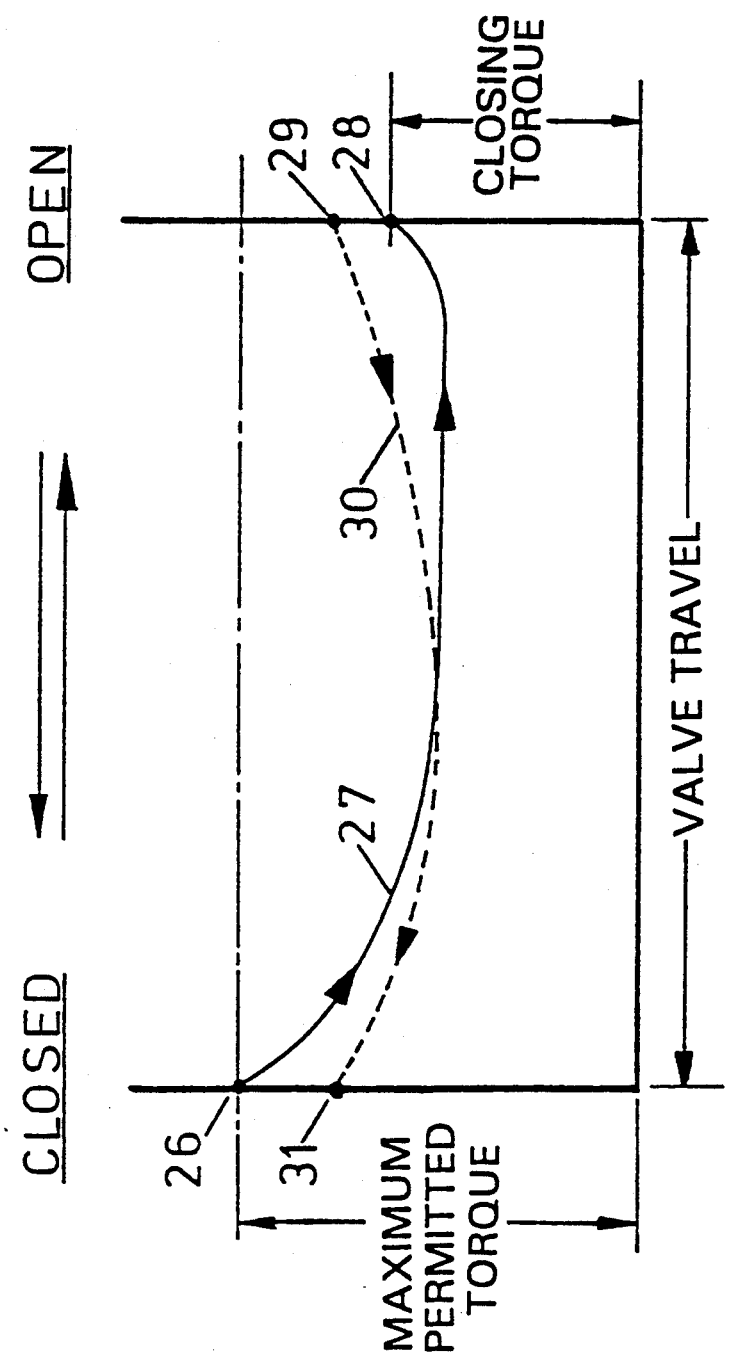
FIG. 2 is a graph of torque against valve stem position, indicating torque profiling.

The presence of a continuous, digitised torque signal combined with a microprocessor operated control module enables a facility for "Torque Profiling" to be included in the actuator operation. By way of an example, FIG. 2 illustrates a typical torque characteristic required for a back seating valve. In such a valve the maximum permitted torque is required to pull the valve off its seat from the closed position—indicated by point 26 on the graph. Once the valve is moving, the limiting torque can be progressively reduced, indicated by curve 27, until the valve is approaching the back seat when a rise can be permitted to the value indicated by point 28. In this way a greater degree of valve protection can be offered in mid-stroke. The torque-off levels could also be made to vary with the wear of the valve, the fluid controlled or other aspects of the duty.

In order to ensure that the valve can be closed from this position, it is necessary to ensure that a torque higher than the value indicated by point 28 is available to overcome the "locked-in" friction torque resulting from the previous opening operation. Thus, for the subsequent closing operation it is desirable to have the available torque raised to a value indicated by point 29 in FIG. 2. The limiting torque, on the closing cycle, can then follow the dotted curve 30 until the valve is seated by the closing torque indicated by point 31. To ensure that the subsequent opening operation can overcome the locked in friction and/or hydrostatic torque, the value indicated by point 31 must be substantially less than the maximum permitted torque setting indicated by point 26.

The limiting torque characteristics, illustrated in FIG. 2, can be achieved in the actuator control module 9 (FIG. 1) by programming the limiting torque values against the combined signals of the column position signal 8 and the direction of rotation of the actuator column, derived from the same signal 8.

There are numerous set-up parameters for a valve actuator including the torque-off levels, and these may be selected by reading bar codes 102 from an instruction manual 101; the bar code reader, for example a hand-held device 100 with button controls, can transfer the data to the actuator using electromagnetic radiation according to 22 above or by electrical connection.

Thus, the input data may include some at least of a multiplicity of different settings and functions and other operating parameters of the actuator, such as: the four main settings of the actuator, i.e. its open and close limit positions and its opening and closing torque-off levels; the rotational sense (clockwise or anti-clockwise) to close the valve; the direction of rotation necessary following emergency shut-down; the operation of warning relays; and the torque profile.

All these input data may be transmitted to the internal receiver to set the operational parameters without the need to gain access to the interior of the actuator.

While bar codes with associated text are the most convenient means of effecting operator selection, waving the reader over a selected pre-printed code, other optical code systems or other remote programming devices would be feasible instead.

For actuators controlling valves in certain vital installations, it is desirable to have an indication of the gear box efficiency during an operation so that any change in the efficiency from the initial or design value can be noted. Generally, a fall off in gear box efficiency will indicate that excessive gear teeth or bearing wear has occurred or the lubricating agent is failing. This diagnostic facility may then be used to give warning of an impending gearbox failure.

Figure 3:
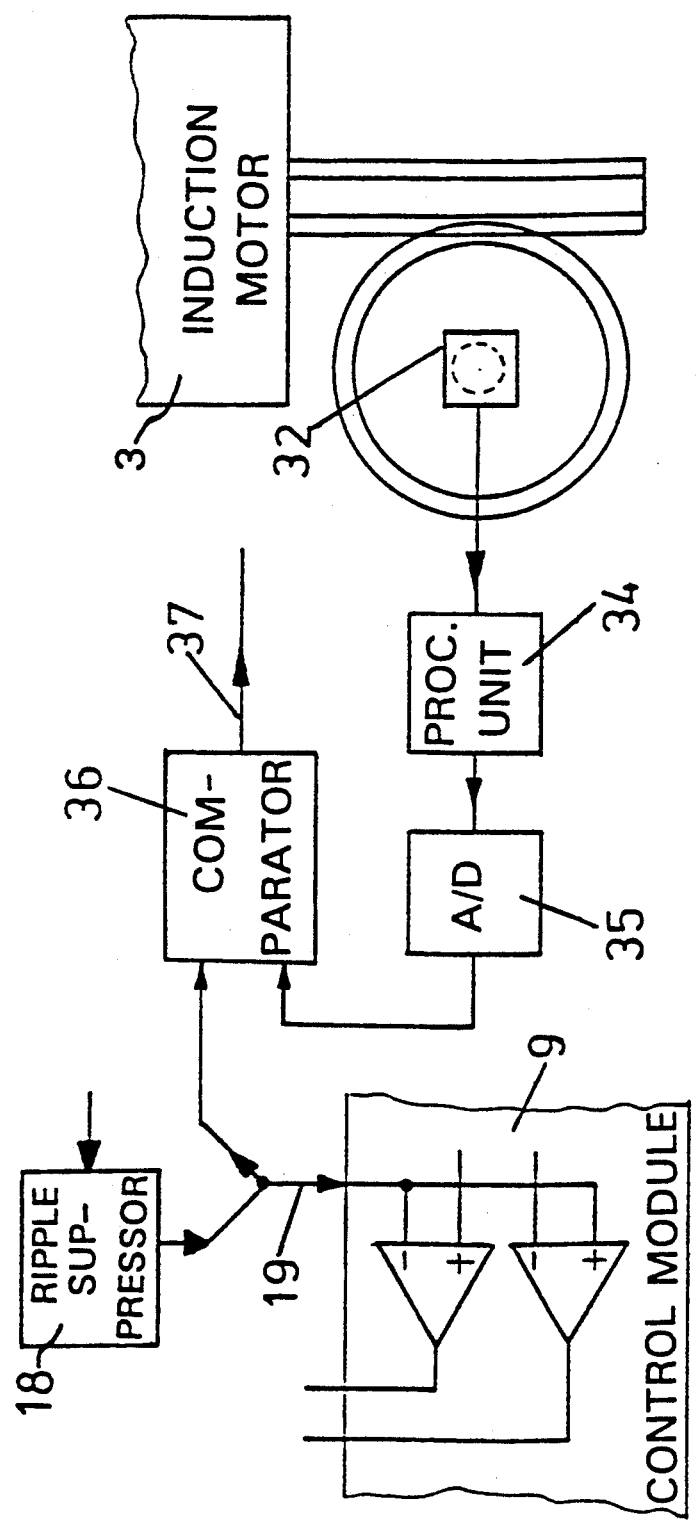
FIG. 3 shows circuitry supplementary to FIG. 1 for obtaining a measure of gearbox efficiency.

The diagnostic facility can be included by an addition to the circuits etc. of FIG. 1—the additional items being shown in FIG. 3 in which a torque transducer 32 is provided to measure the torque being transmitted by the actuator column. This can be done by the use of strain gauges fitted to the column wall or, in the case of a gear box where the final drive to the column is a worm and worm-wheel, a force measuring device can be attached to the worm shaft's axial restraint and this force multiplied by the worm-wheel's pitch radius will provide a measure of the gearbox output torque.

The torque signal 33 obtained is passed to a processing unit 34 and an analogue-to-digital converter 35 in order to obtain a final output torque signal which is in the same or similar form to the signal 19 in FIG. 1 derived from the motor torque. The two signals are then divided in the comparator unit 36, the resultant gear box efficiency being denoted by the expression:

$$\text{Efficiency} = \frac{[\text{Torque at Column}] \cdot [\text{Column angular velocity}]}{[\text{Motor Torque}] \cdot [\text{Motor shaft angular velocity}]}$$

The efficiency signal output 37 from the comparator unit 36 may be used to provide a display, on demand, at the site control station and/or to provide an early warning alarm of impending actuator gear box failure. The control system could be arranged to respond to this alarm condition to prevent further operation of the actuator, either at the moment a predetermined efficiency deviation is reached, or else at the end of one or more subsequent actuating operations.

A feature of electronic torque sensing is that the signal disappears when the motor is de-energised. As a matter of practical convenience it is appropriate to arrange the actuator control circuit so that when the actuator command is terminated as a result of a torque threshold being exceeded the actuator will not respond to commands which would cause it to continue in the same direction. Otherwise repeated short-lived motor starts would occur which could damage the valve or wear out the actuator.

We claim:

1. An actuator comprising an electric motor of the polyphase induction type having a stator with power windings and slots therefore and also having a rotor, and in which only a single flux sensor is provided, the flux sensor being a single sensing coil wound in the stator slots and independent of the power windings, the sensing coil being so arranged that voltages induced therein represent a measure of the magnetic flux existing in an air gap between said stator and said rotor of the motor; the actuator further comprising current sensing means associated with one or more of the stator power windings, and means responsive to signals from the current sensing means and the flux sensor to obtain a motor torque signal representing the instantaneous output torque produced by the induction motor.

2. An actuator according to claim 1, comprising an integration circuit connected to the at least one sensing winding to integrate the sensed voltage.

3. An actuator according to claim 1, comprising control means responsive to the said torque signal to shutdown or otherwise limit the output torque of the motor.

4. An actuator according to claim 2, in which the current sensing means is a single current sensing device responsive to the current in one or more of the mains conductors to the stator power windings, such that the torque signal-producing means multiplies the current and the flux represented by the respective signals from the current sensing means and the flux sensor, and then extracts from this product a steady component thereof.

5. An actuator according to claim 4, in which the torque signal-producing means obtains the steady component of the product by averaging n (an integer greater than 1) samples taken repetitively at intervals of 360°/n of the ripple period of the signal.

6. An actuator according to claim 5, comprising a data processor for computing the said torque and for sampling the product at the said intervals, and programmed with an input representative of the motor's power winding current to compute, in the periods between the sampling instants, the expected motor temperature as a predetermined function of motor current and time.

7. An actuator according to claim 1 further including a valve actuator system, said valve actuator system comprising a valve coupled to said actuator, the actuator having as an output one of an output shaft and an output column, in which the said motor of the actuator is connected to actuate the valve by way of the said output of the actuator, and means for providing a position signal representing the position of the said output of the actuator, in which said actuator control means also responds to said position signal such that a permitted limiting torque applied to the valve by the actuator is varied as a function of one of valve position and operational duty.

8. A system according to claim 7, comprising receiving means responsive to input data representative of predetermined permitted limited torque values as a function of one of valve position and valve travel direction.

9. A system according to claim 8, comprising a separate bar code reader device programmable with at least the said data, and adapted to transmit the data to the receiving means.

10. A system according to claim 7, in which the permitted limiting torque on the valve is a predetermined function of both the position of the valve in its travel between closed and open states and of the direction of movement of the valve.

11. An actuator according to claim 1 further including a valve actuator system, said valve actuator system comprising a valve coupled to said actuator, the actuator having an output drive, in which the motor is connected to actuate said valve by way of said output drive of the actuator, and in which a reduction gear box is provided between said output drive and one of said motor and said valve; means for measuring the output torque from the gearbox; and signal processing means for comparing the measured output torque from the gearbox with the motor torque represented by the said motor torque signal and multiplied by the gear box ratio in order to obtain a signal representing gear box mechanical efficiency.

12. A system according to claim 11, in which the mechanical efficiency is indicated by a display at one of said actuator and a remote station, in response to said efficiency-representing signal.

13. A system according to claim 11, comprising means for comparing the gear box efficiency signal with a pre-set value and responsive to a deviation from the pre-set value by a predetermined amount to provide a warning signal.

14. A system according to claim 13, in which the comparing and warning means, on providing the warning signal, prevent further operation of the actuator, either immediately the predetermined deviation is reached or at the end of one or more subsequent actuating operations.

15. An actuator according to claim 1 further including an electric motor drive system having a final drive section, comprising:

electronic means for measuring the torque generated by the electric motor of the actuator, a transmission between the electric motor output drive and the final drive section of the system, means for measuring the torque developed at a given stage of the transmission, and monitoring means responsive to both of the torque measurements to provide a signal representing the ratio of the torque.

16. A drive system according to claim 15, in which the monitoring means responds additionally to the predetermined velocity ratio of the transmission at the given stage to multiply that by the torque ratio, whereby the signal represents the efficiency of the drive system as far as that given stage.

17. An actuator according to claim 1 further including a valve actuator system comprising:

a control system for the actuator responsive at least to operating parameters of the actuator, said control system including a receiver for input data relating to the actuator operating parameters, and a remote programming device, exterior to the actuator, programmable with the input data and adapted selectively to transmit the recorded input data to the receiver.

18. An actuator and programmer according to claim 17, in which said remote programming device comprises an optical code reader responsive to pre-printed codes representative of the input data to be selected and programmed.

19. A system according to claim 17, wherein the remote programming device is in communication with the actuator by way of a non-contacting interface operating through electromagnetic radiation.

20. An actuator according to claim 1, wherein said polyphase induction motor is operated with a constant frequency supply.

21. An actuator according to claim 4 wherein the current and flux, represented by the respective signals from the current sensing means and the flux sensor, are converted to digital signals, via an analog to digital converter, before reaching said torque signal producing means.

* * * * *